(12) United States Patent
Avraham et al.

(10) Patent No.: US 11,178,392 B2
(45) Date of Patent: Nov. 16, 2021

(54) INTEGRATED OPTICAL EMITTERS AND APPLICATIONS THEREOF

(71) Applicant: Apple Inc., Cupertino, CA (US)

(72) Inventors: Assaf Avraham, Givatayim (IL); Refael Della Pergola, Jerusalem (IL); Roei Remez, Tel Aviv (IL)

(73) Assignee: APPLE INC., Cupertino, CA (US)

( * ) Notice: Subject to any disclaimer, the term of this patent is extended or adjusted under 35 U.S.C. 154(b) by 155 days.

(21) Appl. No.: 16/537,580

(22) Filed: Aug. 11, 2019

(65) Prior Publication Data

US 2020/0081165 A1   Mar. 12, 2020

Related U.S. Application Data

(60) Provisional application No. 62/730,023, filed on Sep. 12, 2018, provisional application No. 62/818,123, (Continued)

(51) Int. Cl.
*H01S 5/022* (2021.01)
*H04N 17/00* (2006.01)
(Continued)

(52) U.S. Cl.
CPC ............. *H04N 17/002* (2013.01); *G02B 5/04* (2013.01); *G02B 5/0858* (2013.01);
(Continued)

(58) Field of Classification Search
CPC .................. H01S 5/0071; H01S 5/0225; H01L 27/14627; G02B 5/04; G02B 5/0858
(Continued)

(56) References Cited

U.S. PATENT DOCUMENTS 6,751,379 B2   6/2004   Capewell et al.
7,257,141 B2 *  8/2007   Chua ................. H01S 5/423
                                                    372/46.013
(Continued)

FOREIGN PATENT DOCUMENTS

CN         102709808 A       10/2012
CN         103412406 A       11/2013
(Continued)

OTHER PUBLICATIONS

Zhan et al., "Confined Etchant Layer Technique (CELT) for Micromanufacture," Proceedings of the 6th IEEE International Conference on Nano/Micro Engineered and Molecular Systems, pp. 863-867, Feb. 20-23, 2011.
(Continued)

*Primary Examiner* — Ricky D Shafer
(74) *Attorney, Agent, or Firm* — Kligler & Associates Patent Attorneys Ltd

(57) ABSTRACT

An opto-electronic device includes a semiconductor substrate having a planar surface. An emitter is formed on the substrate and configured to emit a beam of light away from the planar surface. A reflective layer is formed on the planar surface adjacent to the emitter. A transparent layer is formed over the planar surface and has a curved outer surface including a first segment positioned vertically over the emitter and configured to internally reflect the emitted beam of light toward the reflective layer, and a second segment positioned and configured to collimate and transmit the beam reflected from the reflective layer.

20 Claims, 9 Drawing Sheets

Related U.S. Application Data filed on Mar. 14, 2019, provisional application No. 62/833,718, filed on Apr. 14, 2019.

(51) Int. Cl.

| | |
|---|---|
| *H01L 27/146* | (2006.01) |
| *H04N 5/217* | (2011.01) |
| *G02B 5/04* | (2006.01) |
| *H01S 5/00* | (2006.01) |
| *G02B 5/08* | (2006.01) |
| *H01S 5/0225* | (2021.01) |

(52) U.S. Cl.
CPC .. *H01L 27/14605* (2013.01); *H01L 27/14627* (2013.01); *H01S 5/0071* (2013.01); *H01S 5/0225* (2021.01); *H04N 5/2176* (2013.01)

(58) Field of Classification Search
USPC ............................................. 359/833; 257/98
See application file for complete search history.

(56) References Cited

U.S. PATENT DOCUMENTS

| | | | |
|---|---|---|---|
| 7,825,423 B2* | 11/2010 | Shiraishi | H01L 24/97 257/98 |
| 8,783,893 B1 | 7/2014 | Seurin et al. | |
| 9,048,633 B2 | 6/2015 | Gronenbom et al. | |
| 9,112,330 B2* | 8/2015 | Gronenborn | H01S 5/423 |
| 9,553,423 B2 | 1/2017 | Chen et al. | |
| 9,746,369 B2 | 8/2017 | Shpunt et al. | |
| 10,072,815 B2 | 9/2018 | MacKinnon et al. | |
| 10,295,145 B2 | 5/2019 | MacKinnon et al. | |
| 11,025,898 B2* | 6/2021 | Avraham | H04N 17/002 |
| 2002/0048292 A1 | 4/2002 | Bissinger et al. | |
| 2003/0026310 A1 | 2/2003 | Valliath | |
| 2004/0070855 A1* | 4/2004 | Benitez | G02B 19/0028 359/858 |
| 2006/0045144 A1 | 3/2006 | Karlsen et al. | |
| 2006/0066192 A1* | 3/2006 | Beeson | G02B 27/28 313/112 |
| 2007/0071056 A1 | 3/2007 | Chen | |
| 2008/0054281 A1* | 3/2008 | Narendran | H01L 33/507 257/98 |
| 2008/0267232 A1* | 10/2008 | DeNatale | G01S 19/02 372/27 |
| 2010/0019136 A1* | 1/2010 | Merenda | G21K 1/006 250/251 |
| 2010/0208763 A1 | 8/2010 | Engl et al. | |
| 2012/0147912 A1* | 6/2012 | Moench | H01S 5/14 372/29.02 |
| 2013/0329429 A1* | 12/2013 | Lowes | F21K 9/62 362/247 |
| 2013/0334559 A1* | 12/2013 | Vdovin | H01L 33/54 257/98 |
| 2015/0340841 A1 | 11/2015 | Joseph | |
| 2016/0164261 A1 | 6/2016 | Warren | |
| 2017/0033535 A1* | 2/2017 | Joseph | H01S 5/18308 |
| 2018/0041755 A1 | 2/2018 | Fettig et al. | |

FOREIGN PATENT DOCUMENTS

| | | |
|---|---|---|
| DE | 102007029370 A1 | 11/2008 |
| EP | 0488772 A1 | 6/1992 |
| JP | 09061610 A1 | 3/1997 |
| JP | 2012181243 A | 9/2012 |
| WO | 2010067261 A1 | 6/2010 |
| WO | 2016131658 A1 | 8/2016 |
| WO | 2018053378 A1 | 3/2018 |
| WO | 2019181757 A1 | 9/2019 |

OTHER PUBLICATIONS

Gimkiewicz et al., "Fabrication of microprisms for planar optical interconnections by use of analog gray scale ithography with high-energy-beam-sensitive glass", Applied Optics, vol. 38, No. 14, pp. 2986-2990, May 10, 1999.
CN Application # 201710327709.6 office action dated Apr. 29, 2020.
KR Application # 10-2018-7028292 office action dated May 20, 2020.
International Application # PCT/US2020/015763 Search Report dated Aug. 19, 2020.
International Application # PCT/US2021/027853 Search Report dated Jul. 13, 2021.

* cited by examiner

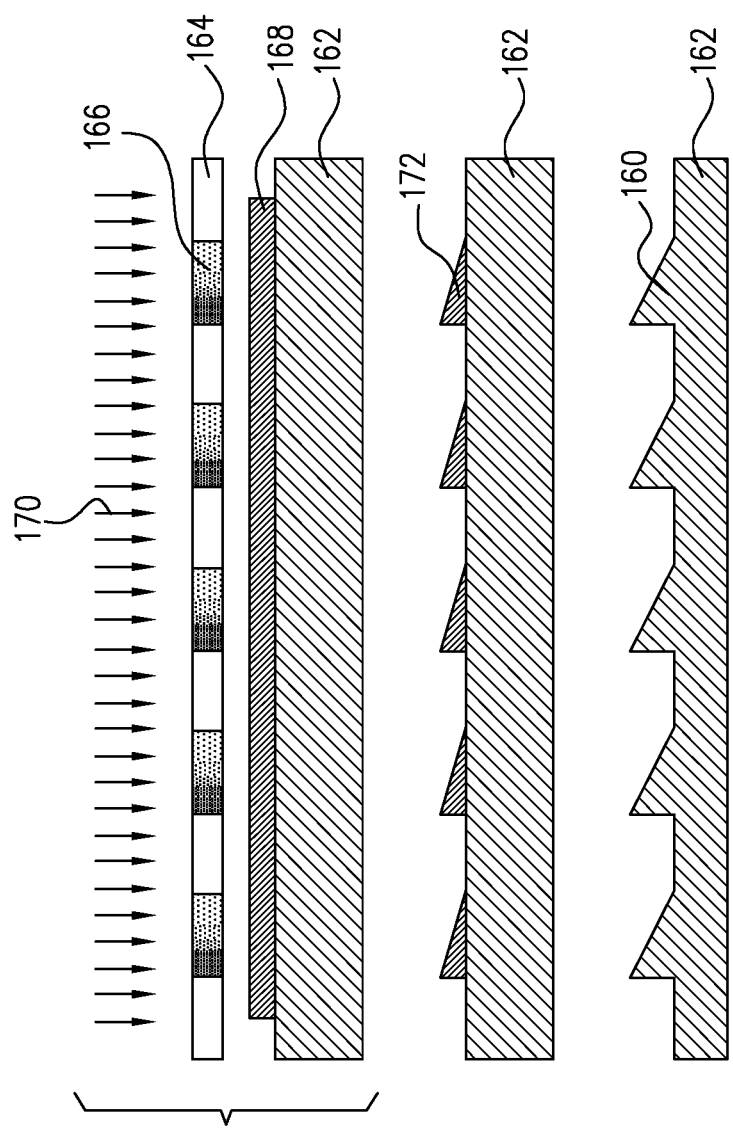

INTEGRATED OPTICAL EMITTERS AND APPLICATIONS THEREOF

CROSS-REFERENCE TO RELATED APPLICATIONS

This application claims the benefit of U.S. Provisional Patent Application 62/730,023, filed Sep. 12, 2018; U.S. Provisional Patent Application 62/818,123, filed Mar. 14, 2019; and U.S. Provisional Patent Application 62/833,718, filed Apr. 14, 2019. All of these related applications are incorporated herein by reference.

FIELD OF THE INVENTION

The present invention relates generally to opto-electronic devices, and particularly to beam-forming optics for optical emitters and applications of such emitters.

BACKGROUND

Light emitters, such as vertical-cavity surface-emitting lasers (VCSELs), are commonly integrated with a small lens (referred to as a microlens) that directs and collimates the emitted beam. An array of such microlenses may be fabricated integrally over a semiconductor substrate on which an array of emitters is formed, with the microlenses in alignment with the emitters.

Compact optical imaging modules are ubiquitous in portable digital devices, such as mobile phones and tablet computers. A typical module comprises imaging optics, comprising one or more lenses, and an image sensor located in the image plane of the optics. Even when the imaging optics and image sensor have been carefully aligned at the time of manufacture, the alignment may shift during the lifetime of the module in the field, for example due to mechanical shocks.

Methods for detecting and correcting for alignment shift are known in the art. For example, U.S. Patent Application Publication 2018/0041755 describes a method in which a scene is imaged using an imaging system, which includes an array of radiation sensing elements. The array includes first sensing elements with symmetrical angular responses and second sensing elements with asymmetrical angular responses, interspersed among the first sensing elements, with optics configured to focus radiation from the scene onto the array. The method includes processing first signals output by the first sensing elements in order to identify one or more areas of uniform irradiance on the array, and processing second signals output by the second sensing elements that are located in the identified areas, in order to detect a misalignment of the optics with the array.

SUMMARY

Some embodiments of the present invention that are described hereinbelow provide integrated emitter devices and methods for their production and use. Other embodiments provide methods and apparatus for detecting lens misalignment in an optical imaging module, including apparatus using integrated emitter devices.

There is therefore provided, in accordance with an embodiment of the invention, an opto-electronic device, including a semiconductor substrate having a planar surface and an emitter formed on the substrate and configured to emit a beam of light away from the planar surface. A reflective layer is formed on the planar surface adjacent to the emitter. A transparent layer is formed over the planar surface and has a curved outer surface including a first segment positioned vertically over the emitter and configured to internally reflect the emitted beam of light toward the reflective layer, and a second segment positioned and configured to collimate and transmit the beam reflected from the reflective layer.

In some embodiments, the emitter includes a vertical-cavity surface-emitting laser (VCSEL). Additionally or alternatively, the reflective layer includes a metal, such as gold. Alternatively, the reflective layer includes at least one dielectric layer. In a disclosed embodiment, the transparent layer includes gallium-arsenide (GaAs).

The first segment may include one or more of a planar surface or a curved surface. In a disclosed embodiment, the first segment is configured to internally reflect the emitted beam of light toward the reflective layer at least twice. Additionally or alternatively, a reflective coating is deposited on the first segment. Alternatively, the first segment is configured to internally reflect the emitted beam of light toward the reflective layer by total internal reflection (TIR).

In a disclosed embodiment, the first segment is configured to reflect the emitted beam of light so that the reflected beam impinges on the second segment along a first axis, and the second segment is configured to collimate and transmit the beam along a second axis, which is not parallel to the first axis.

In embodiments of the invention, the second segment includes one or more of a spherical surface, a Fresnel-lens, and a diffractive optical element (DOE).

There is also provided, in accordance with an embodiment of the invention, a method for fabricating an opto-electronic device, which includes forming an emitter on a semiconductor substrate having a planar surface. A reflective layer is deposited on the planar surface adjacent to the emitter. A transparent layer having a curved outer surface is formed over the planar surface and includes a first segment positioned vertically over the emitter and configured to internally reflect the emitted beam of light toward the reflective layer, and a second segment positioned and configured to collimate and transmit the beam reflected from the reflective layer.

The present invention will be more fully understood from the following detailed description of the embodiments thereof, taken together with the drawings in which:

BRIEF DESCRIPTION OF THE DRAWINGS

FIGS. 9A-C are schematic sectional diagrams illustrating a process for fabricating asymmetrical structures on a substrate, in accordance with an embodiment of an invention;

DETAILED DESCRIPTION OF EMBODIMENTS

Emitters with Micro-Prism-Lenses

Figure 1:
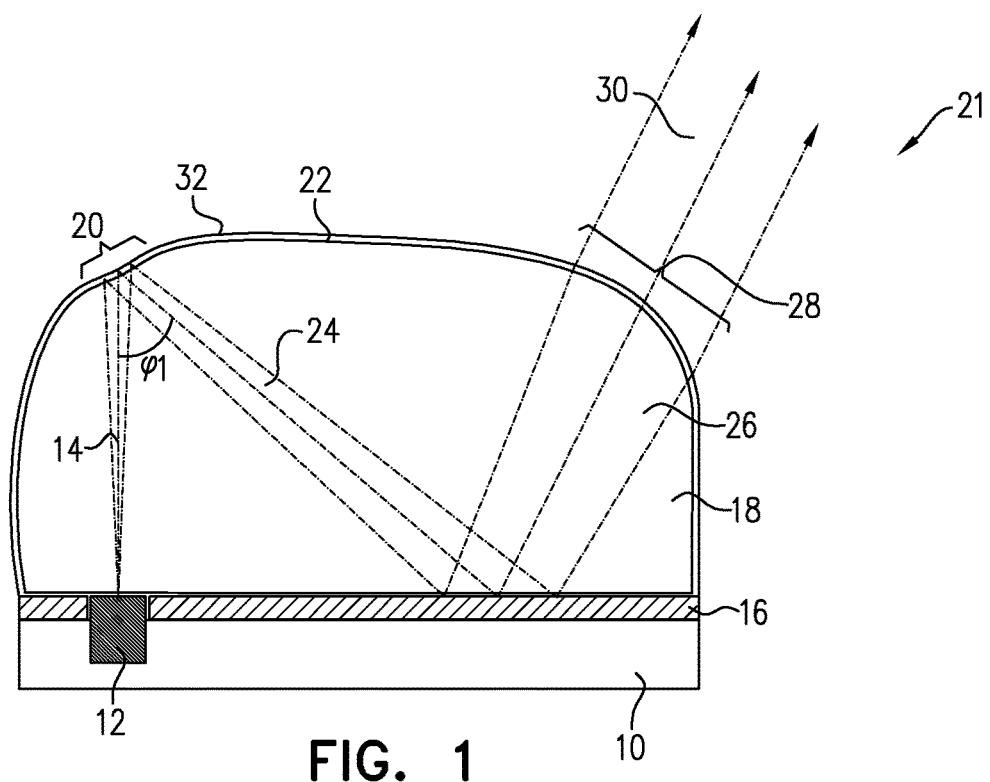
FIG. 1 is a schematic sectional view of an opto-electronic device, in accordance with an embodiment of the invention.

Portable electronic devices, such as cellular phones or tablets, commonly employ one or more integral light sources. These light sources may, for example, provide illumination for a scene recorded by a camera integrated into the device. They commonly comprise a vertically emitting light source, such as a VCSEL, and are constrained to a very small surface area. Moreover, the light sources in these applications may be required to tilt the beam of light emitted by a VCSEL with respect to its substrate and to collimate it.

A VCSEL without any additional collimating optics emits a highly diverging beam in a direction perpendicular to the substrate. Adding a microlens for beam collimation and tilt is not an optimal solution: Inside the microlens, the VCSEL beam has a low divergence due to the high refractive index of the microlens, leading to a small beam diameter before the collimating surface, which, in turn, leads to an inherent divergence due to diffraction. Using the microlens to achieve beam tilt by offsetting the optical axis of the lens from the VCSEL leads to a further reduction of the beam diameter in the direction of the tilt as a function of the cosine of the tilt angle.

Some embodiments of the present invention that are described herein address the above limitations so as to provide a compact optical element, which focuses and deflects the beam emitted by a solid-state emitter, such as a VCSEL, so that the beam exits the optical element at a high tilt angle and with large diameter, relative to solutions that are known in the art. In the disclosed embodiments, an emitter is formed on a semiconductor substrate with a planar surface, and a reflective layer (either using a reflective coating or total internal reflection) is formed on the planar surface adjacent to the emitter. A micro-prism-lens is then formed over the emitter.

The emitter emits a beam of light in a direction away from the planar surface, for example in a vertical direction relative to the surface. The surface of the micro-prism-lens has a first segment positioned above the emitter so as to reflect the emitted beam towards the reflective layer, which further reflects the beam towards a second segment of the surface of the micro-prism-lens. The second segment is formed so as to collimate and transmit the beam out from the micro-prism-lens. The term "collimate" is used in the context of the present description and claims to mean that the divergence of the emitted beam is substantially reduced, typically by at least 50% in angular terms, even if the emitted beam is not fully parallelized by the second segment.

A large-diameter collimated and tilted beam is achieved by two properties of the disclosed micro-prism-lens:

1. The two internal reflections within the micro-prism-lens provide an increased propagation length before the collimating surface provided by the second segment, thus yielding an increased diameter of the collimated beam; and
2. The reflection of the beam from the first segment of the surface of the micro-prism-lens imposes the desired tilt on the beam without reducing its diameter.

Although the embodiments described below relate, for the sake of simplicity, to a single VCSEL emitter and micro-prism-lens, the principles of the present invention can readily be applied to emitters of other types, as well as to provide integrated arrays of micro-prism-lenses over arrays of VCSELs and other emitters.

Embodiments with Two Internal Reflections

FIG. 1 is a schematic sectional view of an opto-electronic device 21, in accordance with an embodiment of the invention.

Optoelectronic device 21 comprises a planar semiconductor substrate 10, for example comprising GaAs, on which a VCSEL 12 is formed by processes of semiconductor device fabrication that are known in the art. VCSEL 12 emits a beam of light 14 in a vertical direction relative to substrate 10, for example at a wavelength between 650 nm and 1300 nm. (The terms "optical radiation" and "light" as used in the present description and in the claims refer generally to any and all of visible, infrared, and ultraviolet radiation.) A reflective layer 16 is formed on substrate 10. In the present embodiment, reflective layer 16 comprises a metal, such as gold, which also serves as an electrode for VCSEL 12, but of extended size so as to function also as a reflector. In alternative embodiments, other metals, such as aluminum, may be used instead of gold. In further alternative embodiments, emitters such as edge-emitting lasers may be used, wherein either the emitter is oriented so that its emitting face is parallel to substrate 10, or a micro-mirror is used to direct the emitted beam in a direction away from the substrate, in a vertical direction or possibly angled relative to the vertical. Alternatively, reflective layer 16 may be separate and independent of the electrodes used to drive the emitter.

A micro-prism-lens 18 is formed over VCSEL 12. Micro-prism-lens 18 comprises a material that is transparent at the wavelength of beam 14, such as GaAs, fused silica, $SiO_2$, epoxy, polymers, or glass. The height of micro-prism-lens 18 may vary from tens of microns, such as 20 or 30 microns, to 2 mm, and width from 60 microns to 6 mm. Micro-prism-lens 18 can be fabricated utilizing methods described below with reference to FIGS. 9A-C, 10A-E, and 11. Reflective coatings and/or anti-reflective coatings can then be deposited on the outer surface of micro-prism-lens, using thin film deposition and patterning techniques that are known in the art.

A first segment 20 of an outer surface 22 of micro-prism-lens 18 is positioned to receive and reflect beam 14 internally into a beam 24. First segment 20 is either flat or concave (as viewed from outside), and is tilted so as to impose a deviation angle $\varphi_1$ between beams 14 and 24. Beam 24 is reflected by gold layer 16 into a beam 26, which impinges on a second segment 28 of surface 20. Second segment 28 has a radius of curvature selected so as to collimate and transmit beam 24 into a beam 30. As noted earlier, the term "collimate" is used in the broader sense of reducing the divergence of a beam, so that beam 30 may be diverging (but less than it would be without micro-prism-lens 18), parallel, or even converging.

Figure 3:
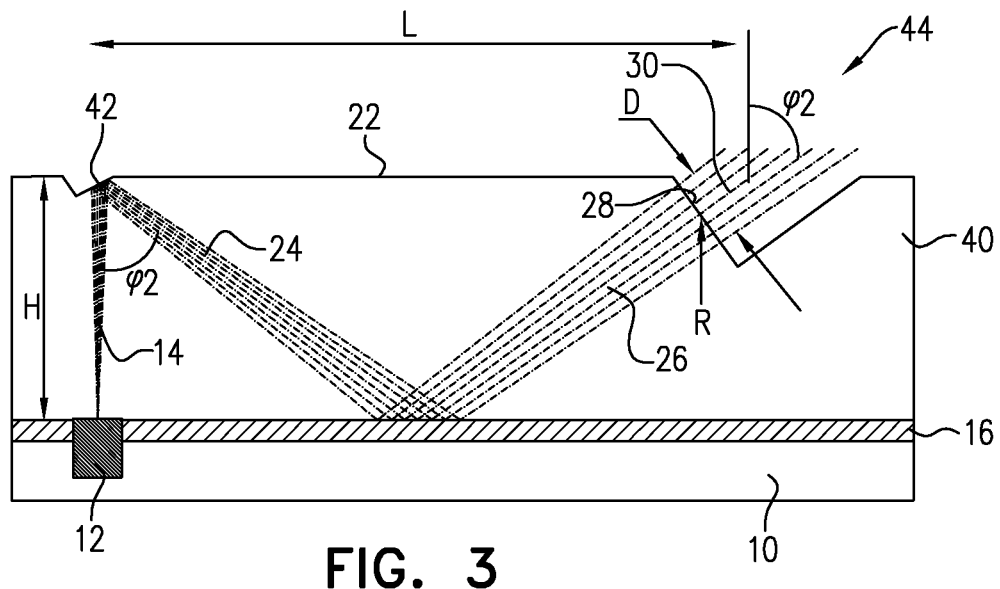
FIG. 3 is a schematic sectional view showing a detail of the opto-electronic device of FIG. 2, in accordance with an embodiment of the invention.

The two internal reflections within micro-prism-lens 18, from first segment 20 and from gold layer 16, increase the propagation length from VCSEL 12 to second segment 28, thus ensuring a sufficient diameter for transmitted beam 30. The deviation angle φ is responsible for imposing a desired tilt onto beam 24, which tilt then propagates through the reflection from gold layer 16 to beam 26 and subsequently to beam 30. By a suitable choice of the design parameters of micro-prism-lens 18, the deviation angle $\varphi_1$ may exceed 55 degrees, and the diameter of beam 30 at second segment 28 may exceed 70 microns. Details of an optical design are shown in FIG. 3, and described below.

Due to the use of a high-index material for micro-prism-lens 18, such as GaAs (n=2.7), the reflection from first segment 20 takes place as a total internal reflection (TIR) as long as the angle of incidence of beam 14 on the first segment is larger than approximately 20 degrees. Additionally or alternatively, surface 22 may be coated by an anti-reflective (AR) coating 32 in order to reduce reflection losses of transmitted beam 30.

In an alternative embodiment, the part of gold layer 16 that reflects beam 24 into beam 26 may be replaced by a reflective dielectric layer, which reflects beam 24 either by TIR or by virtue of a multilayer construction designed for high reflectivity.

The shape of first segment 20 may be determined based on considerations of both manufacturability and functionality: A planar shape may be easier to manufacture and less sensitive to tolerances, whereas a concave shape increases the divergence of beam 24, which then increases the diameter of beam 30.

Figure 2:
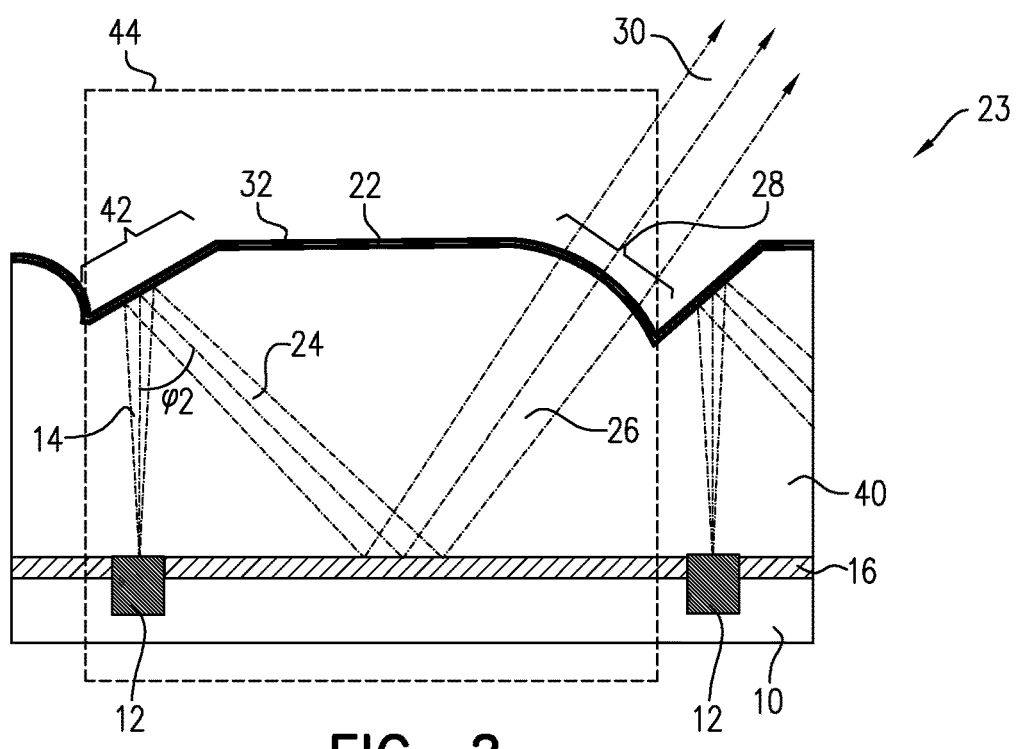
FIG. 2 is a schematic sectional view of an opto-electronic device, in accordance with another embodiment of the invention.

FIG. 2 is a schematic sectional view of an opto-electronic device 23, in accordance with another embodiment of the invention.

Opto-electronic device 23 is similar to device 21, and the same labels in FIG. 2 are used for items similar to those in FIG. 1. Opto-electronic device 23 comprises a micro-prism-lens 40, which is similar to micro-prism-lens 18 of device 21, with a flat first segment 42, and functions in a similar fashion to device 21. When device 23 is incorporated in an illumination array, an array of micro-prism-lenses 40 of this sort can be formed in alignment over a corresponding array of VCSELs 12.

FIG. 3 is a schematic sectional view of a detail 44 of opto-electronic device 23, showing an optical design, in accordance with an embodiment of the invention. For the sake of clarity, anti-reflective coating 32 has been omitted from the figure, but may be included in this embodiment, and second segment 28 is illustrated as a flat surface (with "R" to indicate its radius of curvature). FIG. 3 shows an optical design that yields collimated beam 30 with a diameter of 80 microns and a tilt angle $\varphi_2$ of 54 degrees with respect to a vertical direction. The thickness H of micro-prism-lens 40 is 95 microns, the horizontal center-to-center separation L between first segment 42 and second segment 28 is 700 microns, and the radius of curvature R of the second segment is 705 microns, with the second segment convex toward the outside of the micro-prism-lens. Alternatively, by scaling all the dimensions by a factor of X, the same tilt angle $\varphi_2$ of 54 degrees for collimated beam 30 is achieved, with beam diameter D scaled down to D/X=80/X microns.

Figure 4:
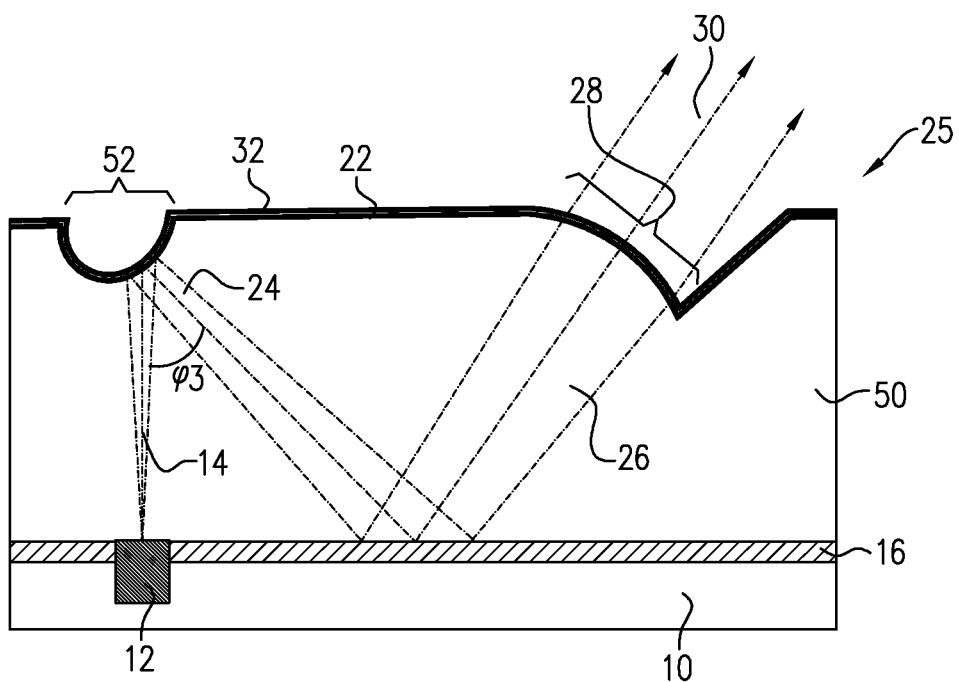
FIGS. 4-8 are schematic sectional views of opto-electronic devices, in accordance with further embodiments of the invention.

FIG. 4 is a schematic sectional view of an opto-electronic device 25, in accordance with yet another embodiment of the invention.

Opto-electronic device 25 is similar to device 21, and the same labels are used in FIG. 4 for items similar to those in FIG. 1. Opto-electronic device 25 comprises a micro-prism-lens 50, which is similar to micro-prism-lens 18 of device 21, except for a first segment 52, which is formed as a concave indentation in the flat outer surface of micro-prism-lens 50. This concave shape is advantageous in increasing the divergence of beam 24, relative to the preceding embodiments.

ALTERNATIVE EMBODIMENTS

Figure 5:
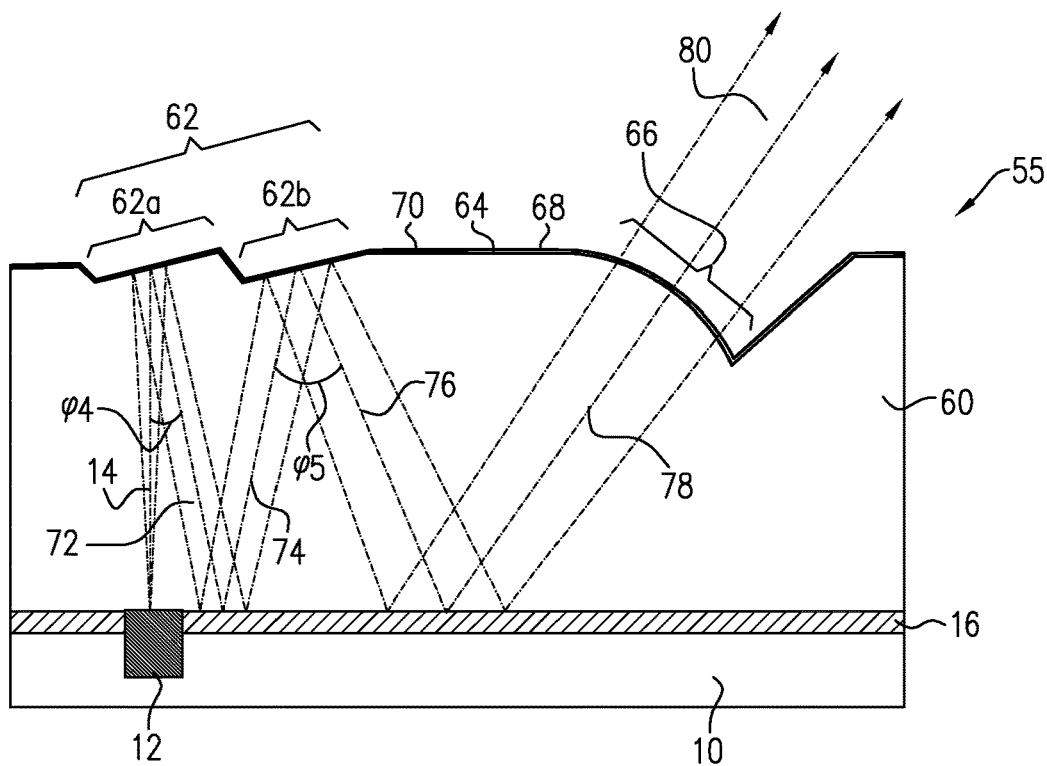

FIG. 5 is a schematic sectional view of an opto-electronic device 55, in accordance with another embodiment of the invention. In this embodiment and the embodiments that follow, the beam from VCSEL 12 is reflected internally four or more times within the micro-prism-lens, thus increasing the optical path length and hence increasing the diameter of the beam that is projected out of the device.

Opto-electronic device 55 comprises the following items that are similar to those of device 21, and are labeled with the same labels: planar semiconductor substrate 10, VCSEL 12, and gold layer 16. As in device 21, VCSEL 12 emits beam of light 14 in a vertical direction relative to substrate 10. A micro-prism-lens 60 is formed over VCSEL 12. Micro-prism-lens 60 comprises, as in device 21, a material that is transparent at the wavelength of beam 14.

A first segment 62 of a surface 64 of micro-prism-lens 60 comprises a first and a second sub-segment 62a and 62b, respectively, wherein both sub-segments are planar, but are not co-planar. A second segment 66 of surface 64 is similar to second segment 28 of device 21. Second segment 66 is coated with an AR coating 68, whereas first segment 62 is coated with a reflective coating 70, comprising aluminum, for example.

First sub-segment 62a receives beam 14 and reflects it into a beam 72 with an angle of deviation of $\varphi_4$, after which beam 72 is reflected by gold layer 16 into a beam 74. Beam 74 impinges on second sub-segment 62b, and is reflected into a beam 76 with an angle of deviation of $\varphi_5$. Beam 76 is reflected by gold layer 16 into a beam 78, which is subsequently collimated and transmitted by second segment 66 into a beam 80.

The two angles of deviation, $\varphi_4$ and $\varphi_5$, can be controlled by adjusting the tilt angles of sub-segments 62a and 62b, thus enabling control of both the tilt angle and the diameter of collimated beam 80. In alternative embodiments (not shown in the figures), first segment 62 may comprise more than two sub-segments, such as, for example, three, four, or even five subsegments. Additionally or alternatively, one or more of the surfaces of the sub-segments of first segment 62 may be non-planar (i.e., concave or convex) for further control of the beam size. For example, a concave shape may be used to increase the diameter of collimated beam 80, whereas a convex shape may be used for either increasing or decreasing the beam diameter.

Figure 6:
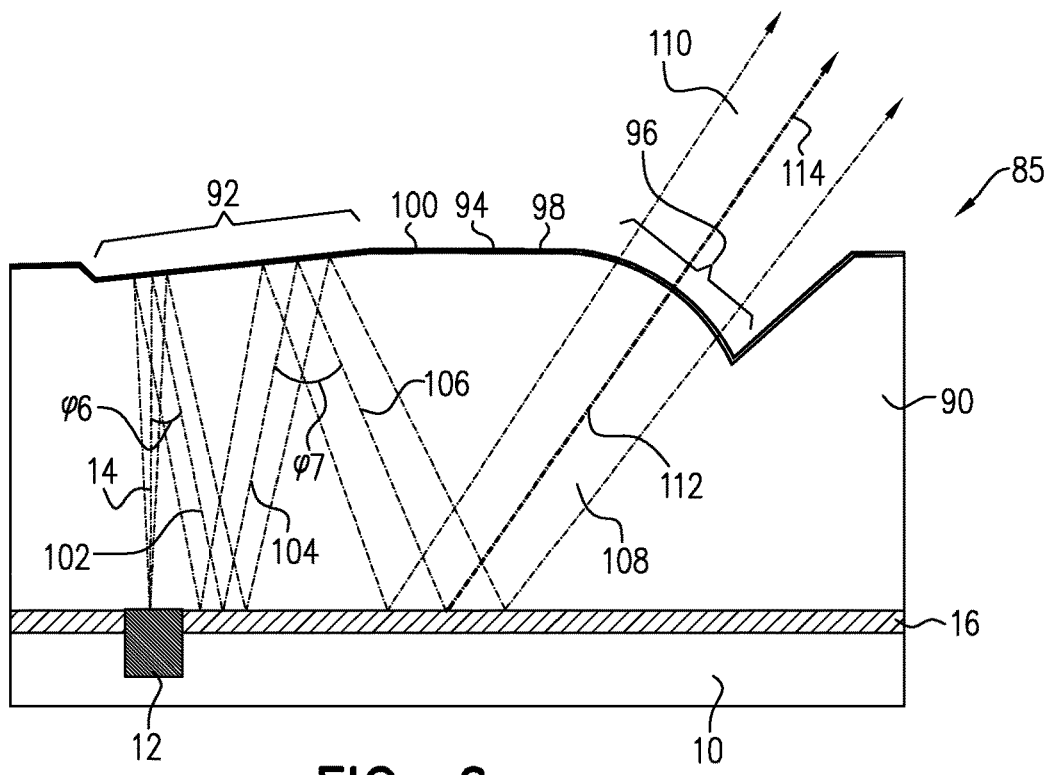

FIG. 6 is a schematic sectional view of an opto-electronic device 85, in accordance with yet another embodiment of the invention.

Opto-electronic device 85 comprises the following items that are similar to those of device 21, and are labeled with the same labels: planar semiconductor substrate 10, VCSEL 12, and gold layer 16. A micro-prism-lens 90 is formed over VCSEL 12 and comprises, as in device 21, a material that is transparent at the wavelength of beam 14.

A first segment 92 of a surface 94 of micro-prism-lens 90 is planar, and dimensioned so as to intercept at least two reflections from gold layer 16, as will be detailed below. A second segment 96 of surface 94 is similar to second segment 28 of device 21. Similarly to opto-electronic device 55, second segment 96 is coated with an AR coating 98, whereas first segment 92 is coated with a reflective coating 100.

First segment 92 receives beam 14 and reflects it into a beam 102 with an angle of deviation of $\varphi_6$, after which beam 102 is reflected by gold layer 16 into a beam 104. Beam 104 impinges back on first segment 92, and is again reflected to gold layer 16, now as a beam 106 with an angle of deviation of $\varphi_7$. Beam 106 is reflected by gold layer 16 into a beam 108, which is subsequently collimated and transmitted by second segment 96 into a collimated beam 110. A central ray 112 of beam 108 and a central ray 114 of beam 110 will be used for comparison in FIG. 7.

With an appropriate choice of width of first segment 92 and its tilt angle with respect to gold layer 16, the first segment may intercept more than two reflections from the gold layer, for example, three, four, or five reflections. Moreover, the beams originating from different reflections from gold layer 16 and impinging on first segment 92 are allowed to overlap on the first segment.

Figure 7:
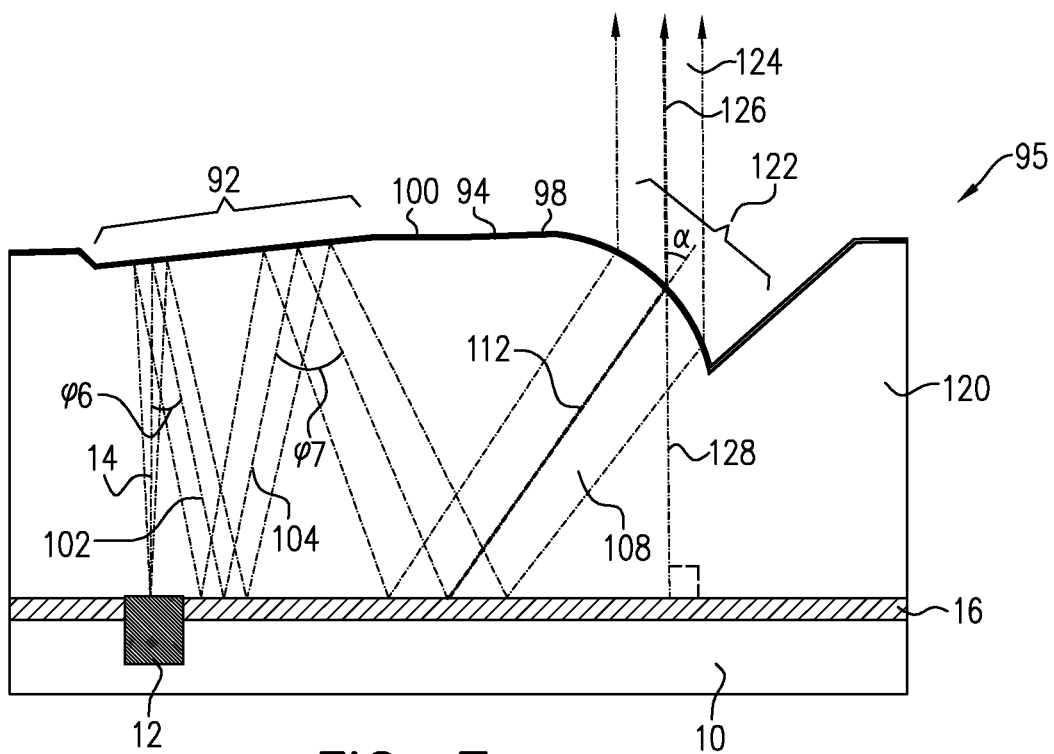

FIG. 7 is a schematic sectional view of an opto-electronic device 95, in accordance with a further embodiment of the invention.

Opto-electronic device 95 is identical to opto-electronic device 85 of FIG. 6, except for a second segment 122 of a micro-prism-lens 120. For all the other items of opto-electronic device 95 the same labels are used as for device 85, and from VCSEL 12 until second segment 122 in device 95, the beams of light follow paths identical to those in device 85.

In device 95, second segment 122 transmits and collimates beam 108 into a beam 124 in such a way that the axis of beam 124 (as represented by a central ray 126 of the beam) is deviated from the axis of beam 108 (as represented by central ray 112) by an angle α with respect to a normal to the second segment, whereas in device 85 central ray 108 continues in a straight line relative to central ray 114. Thus, by choosing the tilt of second segment 122 with respect to central ray 112, the direction of collimated beam 124, and specifically its central ray 126, may be chosen to be either collinear with central ray 112 or at an elevated or lowered angle with respect to central ray 112. The design parameters of micro-prism-lens 120 may be chosen to yield a desired tilt angle of central ray 126 with respect to substrate 10. For example, central ray 126 may be perpendicular to substrate 10, as shown by a dotted line 128. Due to the increased diameter of beam 108 at second segment 122, as previously described, a reduction of the diameter of beam 124 due to the non-normal tilt angle (α≠0) may be more easily tolerated.

Figure 8:
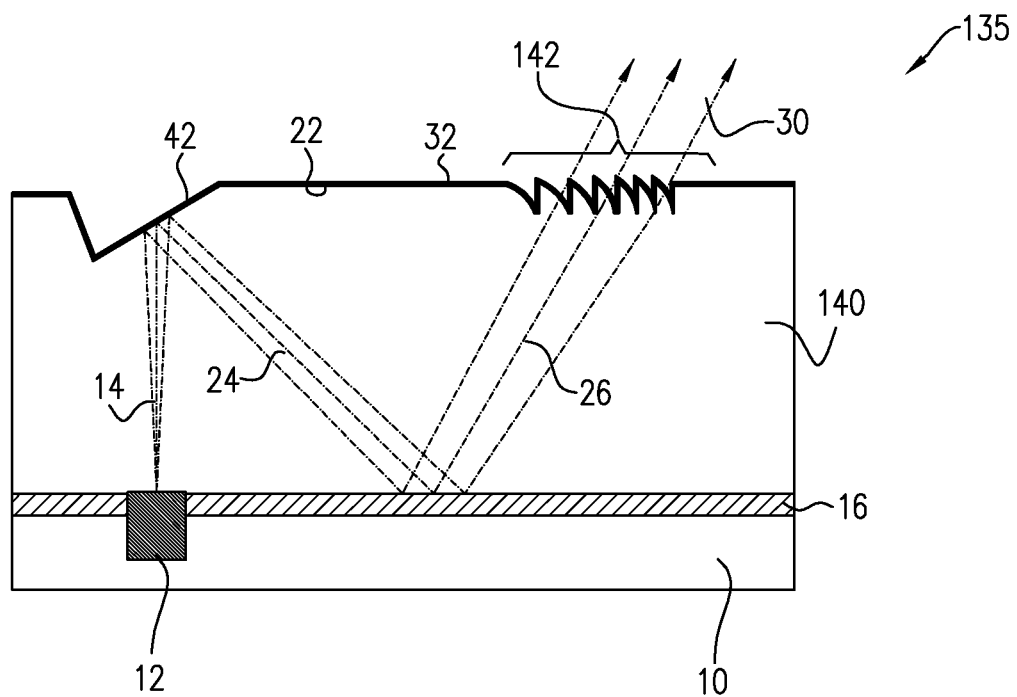

FIG. 8 is a schematic sectional view of an opto-electronic device 135, in accordance with another embodiment of the invention.

Opto-electronic device 135 is similar to section 44 of device 23 (FIGS. 2, 3), and the same labels are used in FIG. 8 for items similar to those in FIGS. 1 and 2. Opto-electronic device 135 comprises a micro-prism-lens 140, which is similar to micro-prism-lens 40 of device 23, except for a second segment 142, which is formed either as a Fresnel-lens or as another type of diffractive optical element (DOE). This embodiment is suitable for designs wherein beam 26 impinges on second segment 142 at a low angle of incidence, such as 10° or less. Additionally or alternatively, first segment 42 may be implemented using a Fresnel-lens or another type of DOE.

FIGS. 9A-C are schematic sectional diagrams illustrating a process for fabricating asymmetrical structures 160 on a substrate 162, in accordance with an embodiment of an invention. Asymmetrical structures 160 of this sort can be used for the purpose of fabricating micro-prism-lenses 18 (FIG. 1), 40 (FIG. 2), 50 (FIG. 4), (FIG. 5), 90 (FIG. 6), 120 (FIG. 7), and 140 (FIG. 8), as will be further described with reference to FIGS. 10A-D.

Asymmetric structures 160 can be fabricated, for example, using the fabrication process described by Gimkiewicz et al., in "Fabrication of microprisms for planar optical interconnections by use of analog gray-scale lithography with high-energy-beam-sensitive glass," *Applied Optics*, Vol. 38, pp. 2986-2990 (1990), which is incorporated herein by reference. The fabrication process utilizes a HEBS (high-energy-beam-sensitive) glass mask 164, wherein a gray-level pattern 166 has been exposed by electron-beam lithography, with further details given in the above-referenced publication by Gimkiewicz et al.

FIG. 9A shows an exposure step of the fabrication process, wherein substrate 162, coated by a photoresist layer 168, is exposed through HEBS mask 164 by ultraviolet (UV) light 170.

FIG. 9B shows the result of a development step, wherein exposed photoresist layer 168 has been developed into asymmetrical photoresist structures 172.

FIG. 9C shows the result of an etch step, wherein the shapes of asymmetrical photoresist structures 172 have been, with the use of reactive-ion etching (RIE), transferred into substrate 162 to form asymmetrical structures 160.

Figure 10A:
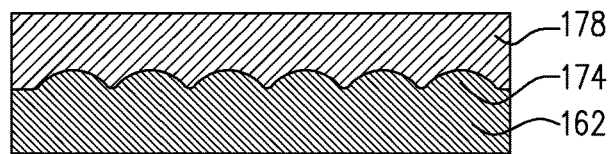
FIGS. 10A, B, C, D, and E are schematic sectional diagrams illustrating a process for producing microlenses on a semiconductor substrate, in accordance with an embodiment of the invention.

Although asymmetrical structures 160 have a simple prismatic form, more complicated forms comprising, for example, curved surfaces, may be produced by generating suitable gray-level patterns in HEBS mask 164. Such structures, comprising microlenses 174 as an example, are illustrated in FIG. 10A, below. Substrate 162 may be a substrate that is etchable by RIE and has the required mechanical properties, such as fused silica.

FIGS. 10A-D are schematic sectional diagrams illustrating a process for transferring microlenses 174 on substrate 162 into a GaAs substrate 176 by the Confined Etchant Layer Technique (CELT), in accordance with an embodiment of the invention. The transfer process utilizes a CELT, described by Zhan et al. in "Confined Etchant Layer Technique (CELT) for Micromanufacture," Proc. *6th IEEE International Conference on Nano/Micro Engineered and Molecular Systems*, pp. 863-867 (2011), which is incorporated herein by reference.

FIG. 10A shows a replication of microlenses 174 on substrate 162, which serves as a mold, into a layer of a polymer, such as PMMA 178. Although the embodiments of FIGS. 10A-D illustrate the transfer of simple microlenses 174, more complex structures may be fabricated, as detailed in FIGS. 9A-C, above. The replication process comprises spinning liquid PMMA over microlenses 174, drying the liquid PMMA into solid PMMA 178, and separating the PMMA from the microlenses, so that the curved shapes of the microlenses are replicated in the PMMA.

Figure 10B:
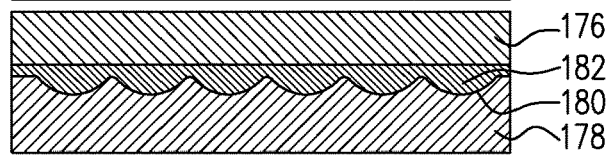

FIG. 10B shows a start of an etching process for transferring the features on the layer of PMMA 178 into GaAs substrate 176. A surface 180 of PMMA 178 has been coated by thin layers of titanium (Ti) and platinum (Pt). It has been brought into close proximity to GaAs substrate 176 (for example, within a hundred microns or tens of microns), with microlenses 174 facing the GaAs substrate. A space 182 between PMMA 178 and GaAs 176 has been filled with a mixture of an etchant and a scavenger, for example with bromide and cystine respectively used as etchant and scavenger. The etchant has been chosen to etch GaAs, but not the layer of inert Pt. The scavenger is used to control the process, as detailed by Zhan et al., cited above.

Figure 10C:
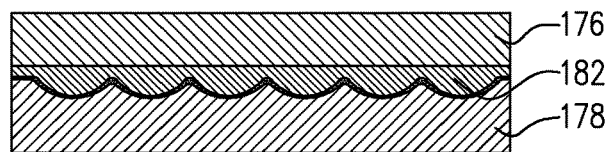
Figure 10D:
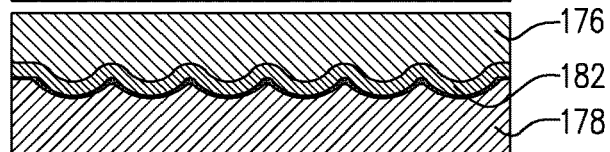
Figure 10E:
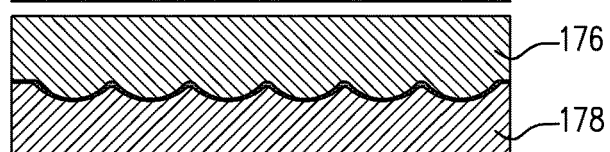

FIGS. 10C, 10D and 10E show the progress of the transfer process, with space 182 continuously diminishing, until in FIG. 10E, PMMA 178 and GaAs 176 have come into contact, and the transfer process has been completed.

Although PMMA is used as a mold in the embodiments described above, other materials, such as silicon or a platinum-iridium (Pt—Ir), alloy may be used as molds when suitably patterned.

Figure 11:
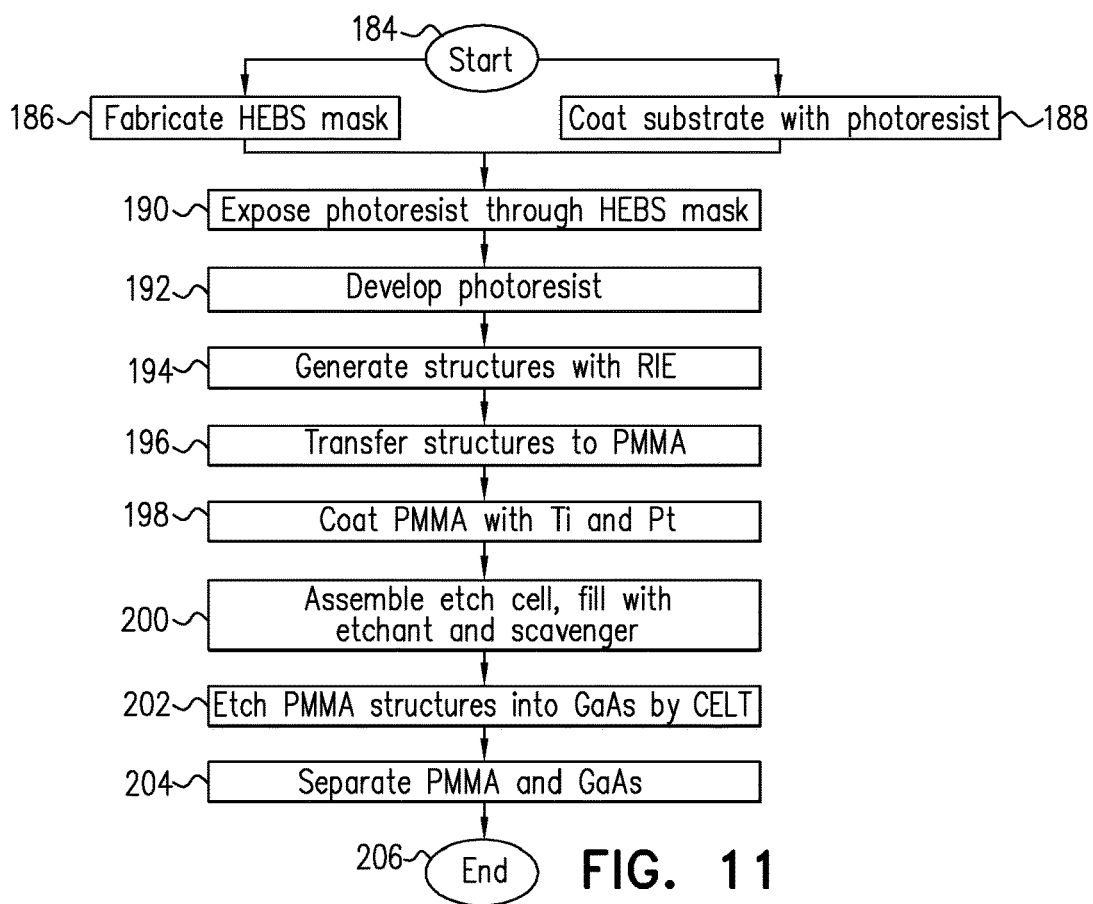
FIG. 11 is a flowchart that schematically illustrates a fabrication process of a micro-prism-lens, in accordance with an embodiment of the invention

FIG. 11 is a flowchart that schematically illustrates the fabrication process of a micro-prism-lens, in accordance with an embodiment of the invention. This flowchart illustrates schematically the processes shown in FIGS. 9A-C and 10A-E for fabricating micro-prism-lenses 18 (FIG. 1), 40 (FIG. 2), 50 (FIG. 4), 60 (FIG. 5), 90 (FIG. 6), 120 (FIG. 7), and 140 (FIG. 8). The additional fabrication steps of optoelectronic devices 21, 23, 25, 55, 85, 95, and 135, such as fabrication of a VCSEL and depositing of anti-reflective and reflective coatings, have not been included in the flowchart for the sake of simplicity, and their implementation will be apparent to those skilled in the art. In the description below, reference is also made to FIGS. 9A-C and 10A-E.

The fabrication starts in a start step 184. In parallel (but not necessarily concurrently), HEBS mask 164 is fabricated in a mask fabrication step 186, and substrate 162 is coated by photoresist 168 in a photoresist coating step 188. In an exposure step 190, photoresist 168 is exposed through HEBS mask 164, as shown in FIG. 9A. In a development step 192, exposed photoresist 168 is developed to produce structures 172, as shown in FIG. 9B. In an RIE step 194, structures 160 are etched into substrate 162, as shown in FIG. 9C.

In a transfer step 196, structures 174 on substrate 162 are transferred into PMMA 178, as shown in FIG. 10A. In a PMMA coat step 198, thin layers of Ti and Pt are deposited on PMMA 178. In an etch cell assembly step 200, PMMA 178 is brought close to GaAs substrate 176, and space 182 is filled with etchant and scavenger, as shown in FIG. 10B. In an etch step 202, structures on PMMA 178 are transferred into GaAs 176, as shown in FIGS. 10C-E. In a separation step 204, PMMA 178 and GaAs 176 are separated from each other. The process ends in an end step 206.

Features of the embodiments shown in FIGS. 1-11 may be combined in additional ways, as will be apparent to those skilled in the art after reading the present description.

Detecting Loss of Alignment in Optical Imaging Modules

The position and tilt of the imaging optics relative to the image sensor in an optical imaging module can play a critical role in the performance of the module. In particular, when the imaging module is used in measurement applications, changes in alignment can lead to inaccurate measurements. For example, many depth mapping systems project a pattern of structured light onto a scene, and then analyze an image of the pattern that is captured by an imaging module in order to compute depth coordinates of objects in the scene by triangulation. A change of the position or tilt of the imaging optics relative to the image sensor can result in a significant error in the estimation of the depth.

Some embodiments of the present invention that are described herein address this problem by periodically sensing the alignment of the image sensor with the imaging optics, and initiating corrective action when a significant shift in alignment is detected. The disclosed embodiments make use of one or more dedicated emitters, which can be built into the optical imaging module and direct beams of radiation toward one or more of the internal surfaces in the module. These surfaces can include, for example, refractive entrance and exit faces of lenses in the imaging optics, as well as interior surfaces of the lens housing. The emitter or emitters are arranged so that the radiation reflected from the internal surface or surfaces is incident on the image sensor. Changes in the pattern of this reflected radiation on the image sensor give an indication of changes in the alignment of the optics with the image sensor.

The disclosed embodiments provide imaging apparatus, such as an optical imaging module, comprising imaging optics, which are mounted in a housing and form an optical image of an object outside the housing. An image sensor, comprising a matrix of detector elements, is positioned and aligned at the focal plane of the imaging optics within the housing. In addition to these standard imaging module components, at least one emitter is fixed within the housing and emits a test beam toward one or more reflective surfaces within the housing. These reflective surfaces, which reflect the test beam toward the image sensor, may comprise, for example, one or more of the refractive surfaces of the lenses in the imaging optics and/or an interior surface of the housing. The test beam may be a directional beam, which is aimed in the desired direction by the sort of micro-prism-lens that is described above.

The image sensor outputs electronic image signals in response to the optical radiation that is incident on the detector elements, including signals in response to the reflected test beam. (The emitter may be actuated to emit the test beam only for short intervals, for example when the imaging module is not in use.) If the alignment of the image sensor with the imaging optics changes, for example due to a mechanical shock, the electronic image signal output by the image sensor due to the reflected test beam will change, as well. A processor receives and processes this electronic image signal in order to detect such changes, and will initiate corrective action when the magnitude of the change is greater than a predefined limit.

For example, a change in the electronic image signal due to the test beam may indicate that the optical image formed by the imaging optics on the image sensor has shifted as the result of a shift in the optical center of the imaging optics. In this case, the processor may compensate for the shift, possibly by applying a counter-shift of the appropriate direction and magnitude to the electronic images output by the image sensor.

Embodiments of the present invention are thus useful in enhancing the accuracy of measurement applications, such as depth sensing, that use imaging modules. Such embodiments can be used to correct certain errors that may result from changes in alignment of the imaging module, and/or to issue an alert when an error is not readily correctable, and measurements are likely to be incorrect. The disclosed embodiments require only minimal hardware additions to imaging module designs, while taking advantage of the existing image sensor and associated image processing capabilities.

For the sake of simplicity in the embodiments that are shown in the figures and described below, only a single emitter is used in generating a test beam. In alternative embodiments, however, multiple emitters are disposed at different, respective locations within the housing, so that each directs a respective beam toward the reflective surfaces of the optics at a different respective angle. The emitters may be operated in sequence, thus generating a sequence of different electronic image signals from the image sensor. The processor can analyze these signals in order to extract a comprehensive picture of any changes in alignment that may have occurred. For example, two emitters may be positioned 90° apart around the optical axis and thus be used in detecting optical shifts along two orthogonal axes. Alternatively or additionally, two emitters may be positioned in close proximity to one another in order to increase the measurement precision.

Figure 12:
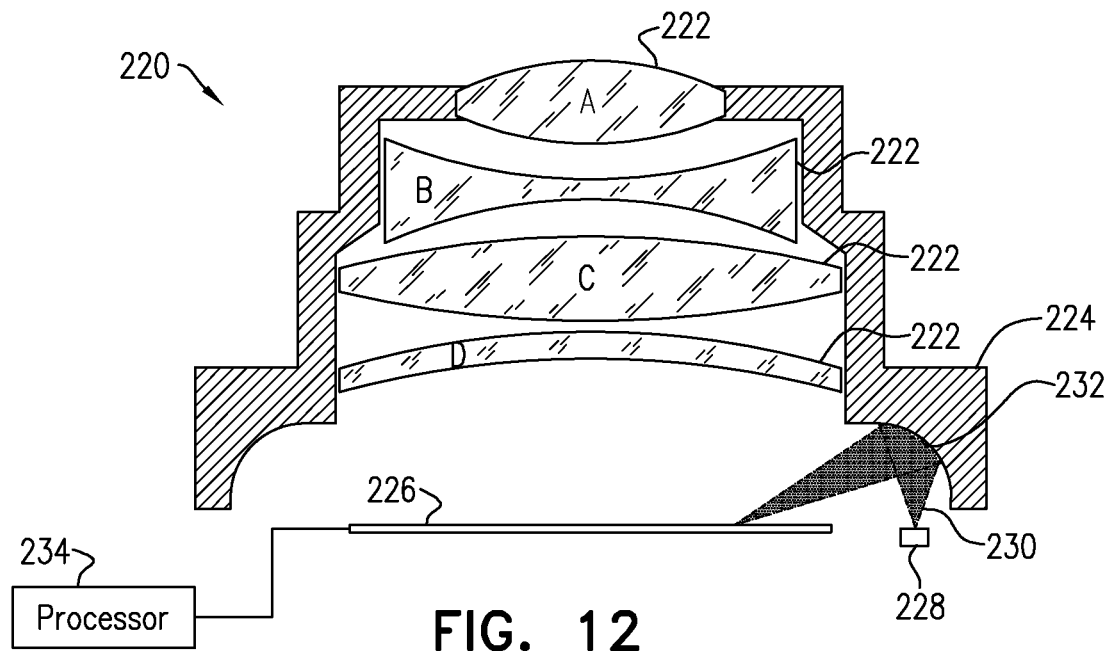
FIG. 12 is a schematic sectional view of an optical imaging module with an emitter for detection of changes in alignment, in accordance with an embodiment of the invention.
Figure 13:
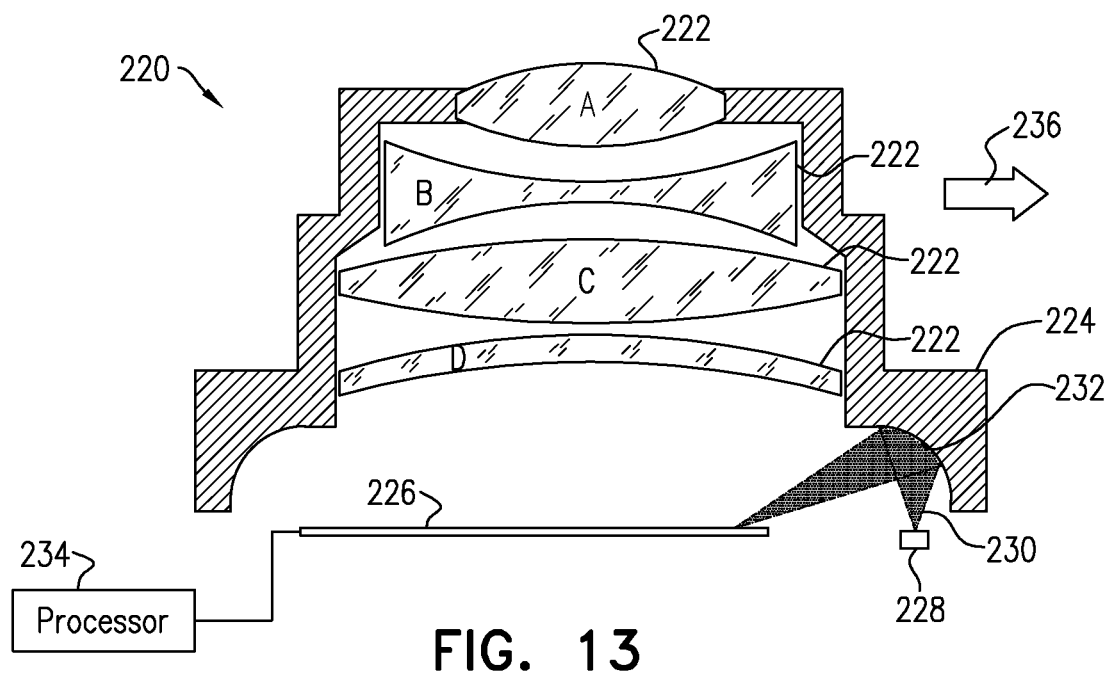
FIG. 13 is a schematic sectional view of the optical imaging module of FIG. 12, showing the effect of a change in alignment.

Reference is now made to FIGS. 12 and 13, which are schematic sectional views of an optical imaging module 220, in accordance with an embodiment of the invention. FIG. 12 shows the components of module 220 in an initial, baseline position, for example following factory calibration of the module, while FIG. 13 shows the effect of a shift in alignment. Although this figure relates only to alignment shift due to element decentering, the principles of the present invention may similarly be applied in detecting other sorts of misalignment, due to element tilt and deformation, for example.

Module 220 comprises imaging optics in the form of lenses 222, labeled A, B, C and D for convenience, which are mounted in a housing 224. Housing 224 may comprise a lens barrel or any other suitable sort of lens mount. Lenses 22 form optical images, at a focal plane within the housing, of objects outside the housing. An image sensor 226 is positioned at the focal plane in alignment with lenses 222. Image sensor 226 typically comprises a matrix of detector elements, as is known in the art, and outputs an electronic image signal in response to optical radiation that is incident on the detector elements. (The term "optical radiation," as used in the present description and in the claims, refers to electromagnetic radiation in any of the visible, infrared and ultraviolet ranges and may be used interchangeably with the term "light.")

An emitter 228 is fixed within housing 224 and emits a test beam 230 toward one or more reflective surfaces within the housing, which reflect the test beam toward image sensor 226. Emitter 228 typically comprises a miniature radiation source, such as a semiconductor laser (including both edge-emitting and vertical-cavity surface-emitting laser (VCSEL) types), or light-emitted diode (LED), and may be conveniently fixed at a location adjacent to image sensor 226, for example on the same circuit substrate. In the present embodiment, emitter 228 emits test beam 230 toward a reflective interior surface 232 of housing 224.

A processor 234 receives and processes the electronic image signal output by image sensor 226 in response to the reflected test beam, and thus detects possible changes in the alignment of the image sensor with the imaging optics. As noted earlier, only short actuation times of emitter 228 are needed for this purpose, so that the effect on the normal operation of module 220 is minimal. Processor 234 typically comprises a programmable microprocessor or microcontroller, which is programmed in software or firmware to carry out the functions that are described herein, and which has suitable input and output interfaces for receiving the electronic image signals from image sensor 226 and outputting alerts and control signals as appropriate. Typically (although not necessarily), processor 234 also performs other processing and control functions in module 220, such as processing images that are formed on image sensor 226 by lenses 222, for example for purposes of depth mapping. Alternatively or additionally, processor 234 comprises hardware logic circuits, which may be hard-wired or programmable.

In the example shown in FIG. 12, reflective surface 232 is shaped as a concave curved mirror, such as an elliptical mirror, which reflects and focuses test beam 230 so as to form a predefined geometrical figure on image sensor 226. The reflective surface is polished but does not generally require an actual mirror coating. Processor 234 is configured to detect changes in the alignment responsively to movement of geometrical figure on the image sensor.

A change of this sort is shown in FIG. 13, in which housing 224 and lenses 222 have shifted relative to image sensor 226, as indicated by an arrow 236, with the result that the optical center of the imaging optics has shifted relative to the image sensor. In this case, processor 234 will detect that the geometrical figure formed on image sensor 226 by reflection of test beam 230 from surface 232 has shifted, as well. Alternatively, movements along other axes can be detected using this technique, including movements along the direction of the optical axis of lenses 222, rather than perpendicular to the optical axis as shown in FIG. 22.

Surface 232 may advantageously be shaped as a cylindrical-elliptical mirror, so that the geometrical figure formed on image sensor 226 is a curved line. Processor 234 can detect movement of this line in the direction of arrow 236 (following a mechanical shock to module 220, for example) with high resolution, particularly using sub-pixel detection algorithms, as are known in the art. The configuration of the elliptical mirror that is shown in FIGS. 12 and 13 creates an amplification in the movement of the line formed on image sensor 226, so that if housing 224 moves by a distance x, the line on the image sensor can move by 25× or more. Combining this movement amplification with sub-pixel detection enables processor 234 to detect relative shifts between the image sensor and imaging optics that are as small as 0.1 pixels, or possibly less.

Figure 14:
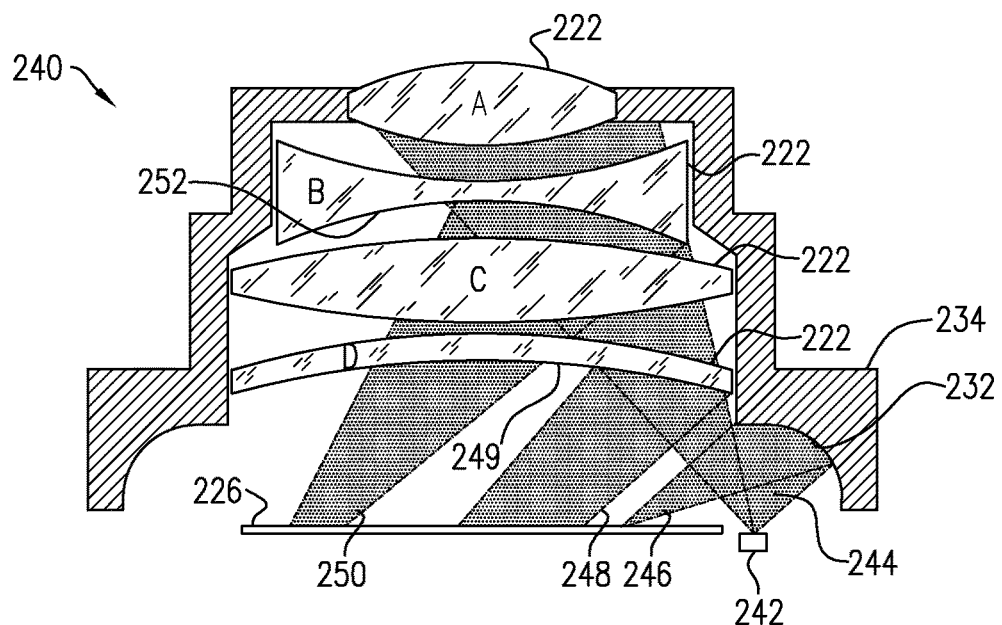
FIGS. 14-16 are schematic sectional views of optical imaging modules with emitters for detection of changes in alignment, in accordance with other embodiments of the invention.

FIG. 14 is a schematic sectional view of an optical imaging module 240, in accordance with another embodiment of the invention. Elements in this figure, as well as in the figures that follow, that are identical or closely similar to their counterparts in optical imaging module 220 are marked with the same indicator numbers as in FIG. 12. Processor 234 is omitted from these figures for the sake of simplicity.

In module 240, an emitter 242 emits a test beam 244 with high angular divergence toward both surface 232 of housing 224 and toward the refractive surfaces of lenses 222. This arrangement gives rise to multiple reflections of beam 244 from the various lens, which are incident on image sensor 226. For the sake of simplicity, however, FIG. 23 shows only reflected beams 248 and 250, which are reflected from and focused by respective concave surfaces 249 and 252 of lenses D and B, along with a reflected beam 246 from surface 232.

Processor 234 processes the electronic image signals due to reflected beams 246, 248 and 250 (and possibly beams reflected from other lens surfaces, whether concave, convex or any other shape) in order to detect changes in the reflected beams that may be indicative of changes in alignment. The changes in this case may be either in the positions of individual lenses 222 or of housing 224 as a whole relative to image sensor 226. A numerical ray-trace simulation can be used to analyze the pattern of reflected beams that appears on image sensor 226 and the influence of movement of various elements of module 240 on the pattern, including the effect of lens refraction on the test beam. Processor 234 can use the simulation results in matching and analyzing the patterns that are formed on the image sensor by the reflected beams, and can thus translate particular pattern changes into the movements that caused the changes. Additionally or alternatively, machine learning algorithms can be used in associating changes in the patterns on the image sensor with movements of elements of module 240.

In many imaging applications, lenses 222 are configured to form optical images of objects in a scene within a certain predefined spectral operating range. Emitter 242 may be chosen to emit test beam 244 at a wavelength outside this spectral range. Frequently, some or all of the refractive surfaces of lenses 222, such as surfaces 249 and 252, are coated to pass the optical radiation within the predefined spectral operating range. For example, in visible imaging applications, the surfaces of lenses 222 may have anti-reflection coatings for visible light. When test beam 244 is at a sufficiently long infrared wavelength, it may be strongly reflected by these coatings, thus enhancing the intensity of reflected beams 248 and 250 and making it easier for processor 234 to detect them. The anti-reflection coatings on the lenses may be optimized for high reflection at the emitter wavelength. As another example, in depth mapping applications using structured light of a given wavelength, some of the surfaces of lenses 222 may have a bandpass coating, which passes the given wavelength while reflecting radiation outside the passband, including test beam 244.

Alternatively, even when the wavelength of test beam 244 is inside the spectral operating range of the module 240, the high incidence angle of the test beam on the lens surfaces will cause the test beam to be strongly reflected. The anti-reflection coatings on lenses 222 can also be optimized to reflect high-angle rays.

Furthermore, if a particular surface is of more interest than others, its coating can be designed accordingly to reflect the wavelength of emitter 242 with larger efficiency than other surfaces.

In general, however, the methods described herein can be used even without any modification of the coating designs, since a certain amount of radiation is always reflected from the optical surfaces, and the optical power of emitter 242 and/or the integration time of image sensor 226 can be adjusted accordingly.

Figure 15:
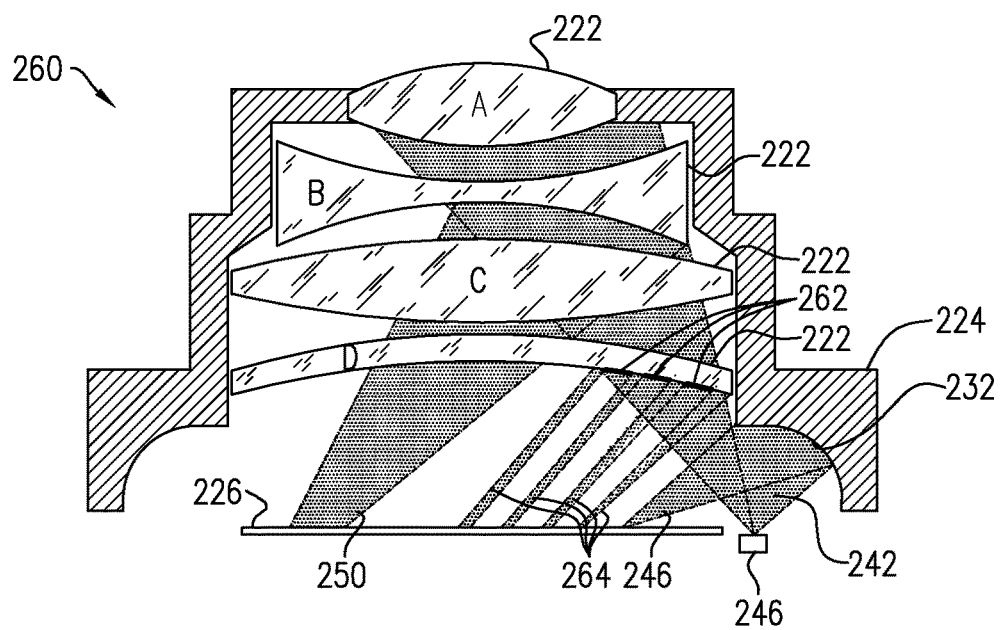

FIG. 15 is a schematic sectional view of an optical imaging module 260, in accordance with a further embodiment of the invention. Module 260 is similar to module 240, as described above, except that in the present embodiment, a pattern 262 is formed on lens D in the area on which test beam 244 is incident. Pattern 262 causes the reflected test beam to form a predefined geometrical figure on the image sensor, such as a corresponding pattern of focused, reflected beams 264. Processor 234 detects movement or changes in the pattern of reflected beams 264, based on the corresponding electronic image signals output by image sensor 226, and is thus able to detect changes in the alignment of lens D relative to image sensor. Other refractive surfaces in module 260 may have similar sorts of patterns for this purpose. Each such surface may have a distinctive pattern to enable their respective reflected beams to be more easily distinguished from one another.

Various sorts of patterns 262 may be used for the purposes of the present embodiment. For example, pattern 262 may comprise one or more radiation-absorbing markings on the lens surface. The markings can be made thin enough to minimize their effect on the normal operation of module 260. A pattern comprising a few lines of this sort with an appropriate equal spacing between them will give rise to an interference pattern on image sensor 226. Fourier analysis can be used to extract the extent of relative movement between lens D and image sensor 226 from changes in the interference pattern. Additionally or alternatively, pattern 262 may be reflecting, which induces a very strong pattern intensity on image sensor 226 and thus makes it possible to decrease the exposure time of the image sensor (and hence reduce its sensitivity to radiation from the scene).

Figure 16:
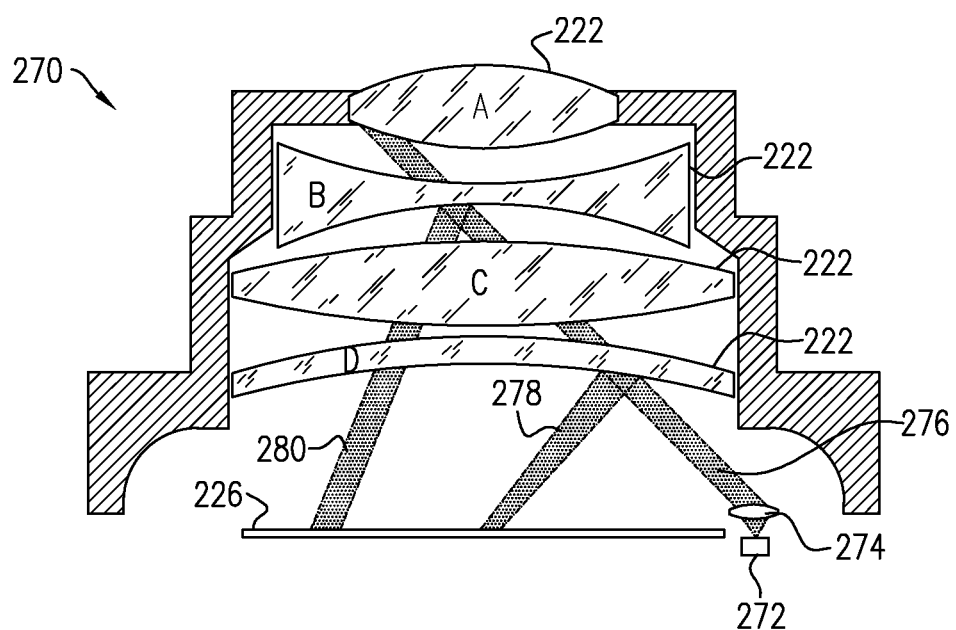

FIG. 16 is a schematic sectional view of an optical imaging module 270, in accordance with yet another embodiment of the invention. In this embodiment, the emitter comprises a radiation source 272, which generates a test beam 276, and a lens 274, which collimates and directs the test beam toward one or more reflective surfaces in module 270. The pictured example shows beams 78 and 80 reflected from the lower, concave surfaces of lenses D and B, respectively (while omitting the beams that are reflected from other surfaces for the sake of simplicity). Lens 274 may advantageously comprise a microlens, which is decentered relative to radiation source 272 in order to create the desired propagation angle within module 270. Although lens 274 is shown in FIG. 16 as a separate component from radiation source 272, the lens may advantageously be a micro-prism-lens, which is integrated with a suitable radiation source, for example as shown in any of FIGS. 1-8 and described above.

Beams 278 and 280 will form respective spots (of different sizes) on image sensor 226, rather than lines or other large-scale features as in the preceding embodiments. Collimation by lens 274 thus increases the signal/noise ratio and sharpness of the pattern, as well as separating the reflections from the different surfaces on the image sensor.

Although the figures above show a specific sort of module design, the principles of the present invention are similarly applicable to other sorts of imaging modules, with different geometries and arrangements of lenses. All such alternative embodiments are considered to be within the scope of the present invention.

It will thus be appreciated that the embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

The invention claimed is:

1. An opto-electronic device, comprising:
a semiconductor substrate having a planar surface;
an emitter formed on the substrate and configured to emit a beam of light away from the planar surface;
a reflective layer formed on the planar surface adjacent to the emitter; and
a transparent layer formed over the planar surface and having a curved outer surface including a first segment positioned vertically over the emitter and configured to internally reflect the emitted beam of light toward the reflective layer, and a second segment positioned and configured to collimate and transmit the beam reflected from the reflective layer.

2. The opto-electronic device according to claim 1, wherein the emitter comprises a vertical-cavity surface-emitting laser (VCSEL).

3. The opto-electronic device according to claim 1, wherein the reflective layer comprises a metal.

4. The opto-electronic device according to claim 3, wherein the metal comprises gold.

5. The opto-electronic device according to claim 1, wherein the reflective layer comprises at least one dielectric layer.

6. The opto-electronic device according to claim 1, wherein the transparent layer comprises gallium-arsenide (GaAs).

7. The opto-electronic device according to claim 1, wherein the first segment comprises a planar surface.

8. The opto-electronic device according to claim 1, wherein the first segment comprises a curved surface.

9. The opto-electronic device according to claim 1, wherein the first segment is configured to internally reflect the emitted beam of light toward the reflective layer at least twice.

10. The opto-electronic device according to claim 1, and comprising a reflective coating is deposited on the first segment.

11. The opto-electronic device according to claim 1, wherein the first segment is configured to internally reflect the emitted beam of light toward the reflective layer by total internal reflection (TIR).

12. The opto-electronic device according to claim 1, wherein the first segment is configured to reflect the emitted beam of light so that the reflected beam impinges on the second segment along a first axis, and wherein the second segment is configured to collimate and transmit the beam along a second axis, which is not parallel to the first axis.

13. The opto-electronic device according to claim 1, wherein the second segment comprises a spherical surface.

14. The opto-electronic device according to claim 1, wherein the second segment comprises a Fresnel-lens.

15. The opto-electronic device according to claim 1, wherein the second segment comprises a diffractive optical element (DOE).

16. A method for fabricating an opto-electronic device, comprising:

forming an emitter on a semiconductor substrate having a planar surface;

depositing a reflective layer on the planar surface adjacent to the emitter; and forming over the planar surface a transparent layer having a curved outer surface including a first segment positioned vertically over the emitter and configured to internally reflect the emitted beam of light toward the reflective layer, and a second segment positioned and configured to collimate and transmit the beam reflected from the reflective layer.

17. The method according to claim 16, and comprising depositing a reflective coating over the first segment of the transparent layer.

18. The method according to claim 16, wherein forming the transparent layer comprises etching the transparent later to define the curved outer surface using a confined etchant layer technique.

19. The method according to claim 18, wherein etching the transparent layer comprises molding a polymer to replicate a shape of the curved outer surface, and using the confined etchant layer technique to transfer the shape to the transparent layer.

20. The method according to claim 16, wherein the transparent layer comprises gallium-arsenide (GaAs).

* * * * *